United States Patent [19]

Gloton et al.

[11] Patent Number: 4,943,464

[45] Date of Patent: Jul. 24, 1990

[54] ELECTRONIC COMPONENT SUPPORT FOR MEMORY CARD AND PRODUCT OBTAINED THEREBY

[75] Inventors: Jean-Pierre Gloton, Aix en Provence; Philippe Peres, Gardanne, both of France

[73] Assignee: SGS-Thomson Microelectronics SA, Gentilly, France

[21] Appl. No.: 278,979

[22] Filed: Dec. 1, 1988

[30] Foreign Application Priority Data

Dec. 14, 1987 [FR] France ............................ 87 17385

[51] Int. Cl.$^5$ .............................................. B32B 3/02
[52] U.S. Cl. ......................... 428/76; 428/209; 428/210; 428/323; 428/446; 428/457; 428/901; 174/52.2; 361/397

[58] Field of Search ................ 428/76, 209, 210, 446, 428/457, 323, 901; 174/52.2; 361/397

[56] References Cited

U.S. PATENT DOCUMENTS 4,661,653  4/1987  Aigo ................................ 174/52.4

Primary Examiner—Patrick Ryan
Attorney, Agent, or Firm—Roland Plottel

[57] ABSTRACT

The disclosure relates to memory cards having an electronic component housed in a cavity. The electronic support has a first base made of silicon, with a small thickness (between 50 and 100 microns) and a thicker (between 200 and 300 microns) second base, which is deposited on the first base and is formed by a material which is harder than silicon, such as cobalt, vanadium, titanium or ceramic.

9 Claims, 1 Drawing Sheet

ELECTRONIC COMPONENT SUPPORT FOR MEMORY CARD AND PRODUCT OBTAINED THEREBY

BACKGROUND OF THE INVENTION

1. Field of the Invention

The invention concerns, generally speaking, memory cards having at least one active electronic component housed in a cavity of said card and, more particularly, a support for a component of this type.

2. Description of the Prior Art

Identification cards are used in many fields, especially in the field of bank cards or credit cards. However, for a long time, apart from an identification number and the bearer's number, these cards have had only a magnetic recording enabling identification by magnetic reading. For many years now, these cards have been used for other functions than for identifying the bearer and, especially, for prepayment and protection against fraudulent activities. To this end, the card has an active electronic component which may consist of an electronic memory which may or may not be associated with a microprocessor, thus enabling its use notably for banking type applications.

Credit cards made with this technology, which have an electronic component, are manufactured in various ways. According to a first method, a cavity is made in the thickness of the card to accommodate the electronic component. According to another method, known as "co-lamination", thin layers of plastic material, such as polyepoxy, polyethylene, polyvinyl chloride etc. are laminated around the component. During the implementation of these methods, various other operations are further performed to electrically connect the terminals of the electronic component with metallizations placed on the surface of the card.

One of the methods used to install the electronic component in the cavity made in the card and to place metallizations on the card, as well as to make the connections between the terminals of the card and the metallizations consists, as shown in FIG. 1, in the use of a non-conductive film 1, made of polyepoxy for example. This film has, on one side, the electronic component in the form of a chip 2 and, on the other side, metallized surfaces such as those marked 3, 4 and 5, separated from one another by spaces 6 and 7 without metallization. These metallized surfaces 3, 4 and 5 communicate with the other side of the film 1 by means of holes 8, 9 and 10 through which the ends of the conducting wires 11, 12 and 13 are connected with the corresponding metallized surfaces by any known means such as a conductive bonder. The other end of each conducting wire is connected to an output terminal 14, 15 or 16 of the chip 2.

These operations are then followed by the coating of the chip 2 with resin and curing of the resin, by heat, to encapsulate the chip. The chip can then be installed in the cavity of the card and the metallizations can be placed at the edge of the cavity by simply fitting in the chip and bonding the support film 1 to the card after it has been cut out to the requisite dimensions.

A method of this type results in a structure in which the chip 2 is bonded to the frame 1, to which adheres a layer of metallic zones. The set formed by the film and the metallic layer is relatively flexible. It is more flexible than the card made of polyepoxy, while the chip, the base of which is a silicon base or substrate which is several hundreds of microns thick (for example, 280 microns thick) is rigid, hard and brittle. This results in strains, particularly when the identification or identity card is handled without precautions. These strains cause breaks in the silicon substrate and, hence, the destruction of the chip.

One solution to this problem consists in increasing the thickness of the silicon substrate, but this approach is limited by the depth of the card. Moreover, a greater thickness naturally increases the overall mechanical strength of the chip, but the chip remains fragile with respect to shocks.

The object of the present invention, therefore, is to make an electronic component support the overcomes the above-mentioned drawbacks, without any increase in the thickness of the final component, and which protects the electronic component from mechanical damage which may be caused, in particular, by violent handling of the card in which the component is housed.

SUMMARY OF THE INVENTION

The invention therefore relates to an electronic component support for a memory card which has a cavity to house said component, said support comprising a first silicon socket of small thickness, one side of which is used as the substrate for the manufacture of the different elements of the electronic component, and comprising a second socket made of a harder material than silicon which is fixed to the other side of the first socket.

BRIEF DESCRIPTION OF THE DRAWINGS

Other features and advantages of the present invention will emerge from the following description of a particular embodiment, said description being made with reference to the appended drawings, of which:

FIG. 1 corresponds to the prior art and has been described in the introduction.

DESCRIPTION OF A PREFERRED EMBODIMENT

Figure 2:
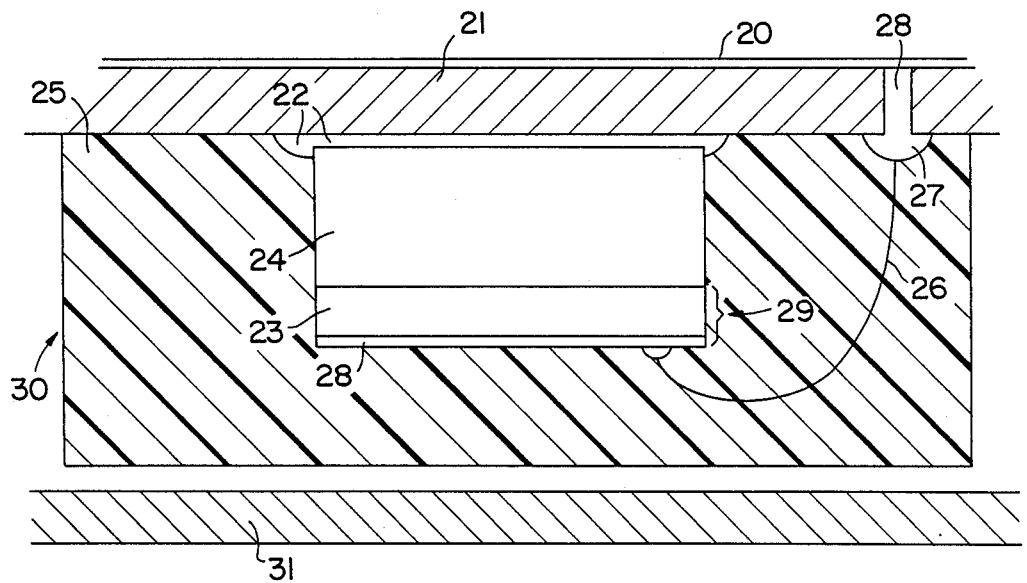
FIG. 2 shows a partial sectional view of an identification card having a cavity in which the electronic component according to the invention is housed.

The schematic view of FIG. 2 shows an electronic component 29 with a silicon base or substrate on which are made the various layers 28 to obtain the different components of the circuit.

Figure 1:
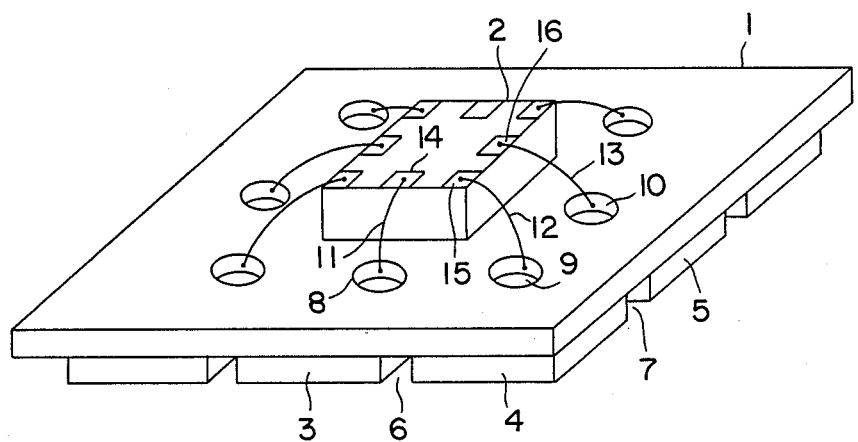
FIG. 1 shows a perspective view of a supporting film for electronic components and its electrical connections according to the prior art.

According to the prior art, the base 23 is about 300 microns thick and this base is fixed to a supporting film 21 by a layer of bonder. The side of the film 21, which is opposite the electronic component side, carries a metallic layer 20 which is divided into contact zones, such as those marked 3 and 4 in FIG. 1.

This prior art structure is fragile for the silicon substrate is in direct contact with the flexible film 21, via the layer of bonder. This may result in breaks in the substrate and, hence, in total damage to the electronic component. An obvious solution to this problem is to increase the thickness of the substrate, but this approach is limited because the component and its shielding capsule 25 cannot, together, exceed a thickness of about 600 microns which is the depth of the cavity of the supporting card.

Thus, according to the present invention, it is proposed to substantially reduce the thickness of the silicon substrate or base 23 and to replace the removed thickness by a second base made of a material having greater mechanical strength than silicon. More precisely, the thickness of the silicon is reduced to 50 microns and the rest of the base (200 to 250 microns) consists of materials such as titanium, cobalt, vanadium, a ceramic or, again, a fiber-glass charged plastic.

To make this new base, the method starts with a 50-micron thick silicon substrate on which the structure hardening material is deposited by any prior art method (for example by vacuum deposition). It is with this new substrate that all the diffusion and deposition operations are performed in the silicon layer 23 to obtain the electronic component. The electronic component is then fixed by its base 24, made of hardening material, to the film 21, by means of a layer of bonder 22. Each output terminal of the component on the silicon side is then connected by a conducting wire 26 and a solder 27 to a contact zone of the metallic layer 20 through a hole 28 of the film 21. In the next operation, the electronic component and the conducting wires are encapsulated in a resin 25 so as to protect the set. After this operation, the entire unit (formed by the encapsulated component, the supporting film and the metallic layer) is installed in the cavity 30 of the card provided for this purpose, this cavity being closed by a bottom cover 31 which is an integral part of the card. This second base 24, made of a hard material, is used to protect the first base 23, made of silicon, without increasing the thickness of the structure.

The invention has been described on the assumption that the electronic component is fixed on a supporting film, but it can also be applied to cases where the supporting film is not used.

What is claimed is:

1. An electronic component support for a memory card which has a cavity to house said component, said support comprising a first silicon base of 50 to 100 microns thickness, one side of which is used as the substrate for the manufacture of the different elements of the electronic component, and comprising a second base of 100 to 300 microns thickness made of a harder material than silicon, and selecting from the group consisting of titanium, cobalt, vanadium, ceramic, and fiber-glass-charged plastic, which is fixed to the other side of the first base, the second base being fixed to a film which acts as an element to close the cavity.

2. An electronic component support according to claim 1, wherein the material of the second base is titanium.

3. An electronic component support according to claim 1, wherein the material of the second base is cobalt.

4. An electronic component support for identification cards according to claim 1, wherein the material of the second base is vanadium.

5. An electronic component support according to claim 1, wherein the material of the second base is of ceramic.

6. An electronic component support according to claim 1, wherein the material of the second base is fiber-glass-charged plastic.

7. An electronic component support according to claim 1, wherein the thickness of the first base is about 50 microns.

8. An electronic component support according to claim 1, wherein the thickness of the second base ranges between 200 and 250 microns.

9. A memory card provided with a cavity to house an electronic component, wherein a said component lies on a support according to claim 1.

* * * * *